(12) United States Patent
Fleischer et al.

(10) Patent No.: US 11,821,093 B2
(45) Date of Patent: Nov. 21, 2023

(54) DEHUMIDIFICATION OF A PHOTOVOLTAIC MODULE BY MEANS OF ELECTROLYSIS

(71) Applicant: Siemens Energy Global GmbH & Co. KG, Bayern (DE)

(72) Inventors: Maximilian Fleischer, Hohenkirchen (DE); Roland Pohle, Herdweg (DE); Elfriede Simon, Munich (DE); Oliver von Sicard, Munich (DE)

(73) Assignee: Siemens Energy Global GmbH & Co. KG, Bayern (DE)

( * ) Notice: Subject to any disclaimer, the term of this patent is extended or adjusted under 35 U.S.C. 154(b) by 0 days.

(21) Appl. No.: 17/794,974

(22) PCT Filed: Dec. 17, 2020

(86) PCT No.: PCT/EP2020/086634
§ 371 (c)(1),
(2) Date: Jul. 24, 2022

(87) PCT Pub. No.: WO2021/151585
PCT Pub. Date: Aug. 5, 2021

(65) Prior Publication Data
US 2023/0100350 A1 Mar. 30, 2023

(30) Foreign Application Priority Data
Jan. 31, 2020 (EP) .................... 20154798

(51) Int. Cl.
*C25B 1/04* (2021.01)
*C25B 15/08* (2006.01)
(Continued)

(52) U.S. Cl.
CPC .............. *C25B 1/04* (2013.01); *C25B 15/083* (2021.01); *H01L 31/0481* (2013.01); *H01L 31/054* (2014.12); *H02S 40/00* (2013.01)

(58) Field of Classification Search
CPC ............ H02S 40/20; H02S 40/00; C25B 1/04
See application file for complete search history.

(56) References Cited

U.S. PATENT DOCUMENTS 5,096,549 A * 3/1992 Yamauchi .............. B01D 53/26
204/266
2012/0103187 A1* 5/2012 Roa Fresno ........ H01L 31/0521
96/115
(Continued)

FOREIGN PATENT DOCUMENTS

CN 105470393 A 4/2016
CN 106876586 A 6/2017
(Continued)

OTHER PUBLICATIONS

PCT International Search Report and Written Opinion of International Searching Authority dated Mar. 22, 2021 corresponding to PCT International Application No. PCT/EP2020/086634 filed Dec. 17, 2020.

*Primary Examiner* — Bethany L Martin
(74) *Attorney, Agent, or Firm* — Wolter Van Dyke Davis, PLLC

(57) ABSTRACT

A photovoltaic module has at least one solar cell, wherein the solar cell is enclosed by an encapsulation apparatus, and an electrolysis unit for dehumidifying the interior of the encapsulation apparatus. The electrolysis unit has a cathode, an anode, and an ion conductor connecting the cathode and the anode. The electrolysis unit is designed to cleave water in hydrogen and oxygen. A method for dehumidifying a photovoltaic module is accomplished by the electrolysis unit.

18 Claims, 1 Drawing Sheet

(51) Int. Cl.
  *H02S 40/00* (2014.01)
  *H01L 31/054* (2014.01)
  *H01L 31/048* (2014.01)

(56) References Cited

U.S. PATENT DOCUMENTS

2017/0149005 A1   5/2017  Suzuka
2022/0242752 A1*  8/2022  Vincenzi ............... C25B 11/077

FOREIGN PATENT DOCUMENTS

| CN | 108807695 A | 11/2018 |
| CN | 209526112 U | 10/2019 |
| JP | H04126518 A | 4/1992 |
| JP | H1071319 A  | 3/1998 |

* cited by examiner

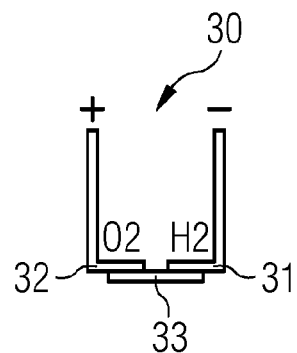
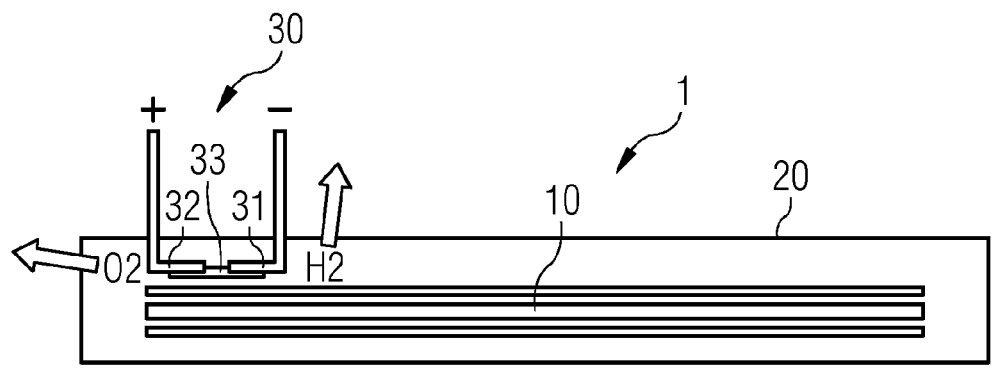
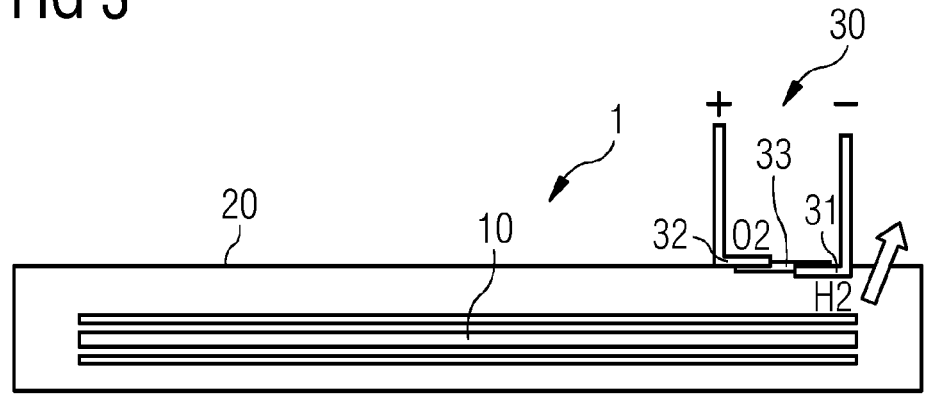

DEHUMIDIFICATION OF A PHOTOVOLTAIC MODULE BY MEANS OF ELECTROLYSIS

CROSS REFERENCE TO RELATED APPLICATIONS

This application is the US National Stage of International Application No. PCT/EP2020/086634 filed 17 Dec. 2020, and claims the benefit thereof. The International Application claims the benefit of European Application No. EP20154798 filed 31 Jan. 2020. All of the applications are incorporated by reference herein in their entirety.

TECHNICAL FIELD

The invention relates to a method for dehumidifying a photovoltaic module and to a photovoltaic module having such a device.

BACKGROUND OF INVENTION

Perovskites, such as $CH_3NH_3PbI_3$, have been investigated for some years with respect to their usability in solar cells. By virtue of their optoelectronic properties, they in principle permit highly efficient conversion of electromagnetic radiation energy into electrical energy. Perovskite-based solar cells, also referred to below as perovskite solar cells, are notable firstly in that they are comparatively inexpensive to produce. In addition, perovskite solar cells are an attractive and credible alternative to conventional silicon-based solar cells, because the progress that has rapidly been made in recent years with respect to their efficiency, from a few percent to over 25% today, indicates that efficiencies that significantly surpass those of conventional silicon solar cells can be achieved. It is conceivable here to operate a perovskite solar cell on its own or else in a tandem photovoltaic module, for example in combination with a crystalline silicon solar cell.

A disadvantage of perovskite material in comparison to silicon is its high moisture sensitivity. Even small amounts of moisture can lead to serious damage to perovskite solar cells, this damage ultimately leading to an often irreversible reduction in the efficiency of the perovskite solar cell and thus to a low yield of electrical energy from a corresponding photovoltaic module that has perovskite solar cells.

However, moisture that penetrates into a photovoltaic module generally leads to a shortening of the lifetime of the module even in the case of modules with conventional silicon solar cells. This is caused primarily by corrosion in electrically conducting connections of components in the photovoltaic module through which current flows. It is thus desirable to avoid moisture within the module in the case of photovoltaic modules with silicon solar cells as well.

It is for these reasons that, in the prior art, the solar cells in a photovoltaic module are encapsulated for example with a glass-glass encapsulation that is adhesively bonded at the edge with polymer. Alternatively, a multilayer encapsulation (that is often of flexible design) composed of organic and inorganic layers is also possible (for example a combination of nitrides and oxides).

Satisfactory results are generally achieved in this way and cells that have been encapsulated in such a way pass the standard load tests for photovoltaic modules, consisting, inter alia, in subjecting the photovoltaic module to high moisture concentrations at elevated temperatures. However, since every real encapsulation has a leakage rate, even if it is low, in long-term operation there is a certain risk of the slow ingress of moisture with resultant degradation in the performance of the photovoltaic module.

As an alternative or in addition, moisture-absorbing materials can also be introduced into the encapsulation. However, these will be exhausted in the long term due to the limited amount of material, and so even in this case an ingress of moisture into the photovoltaic module is to be expected in the long term (timescale of 20-25 years).

The problem addressed by the inventors was therefore that of developing a concept by which the interior of a photovoltaic module can be kept dry as efficiently and permanently as possible.

SUMMARY OF INVENTION

The solution to this problem is disclosed in the independent claims, which claim a method for dehumidifying a photovoltaic module and a photovoltaic module that has correspondingly been modified in comparison to the prior art. Advantageous embodiments and refinements are disclosed in the dependent claims, the description and the drawings.

A photovoltaic module with one or more solar cells and an encapsulation device is specified. This encapsulation device encloses the solar cell. The photovoltaic module according to the invention is characterized in that it also has an electrolysis unit for dehumidifying the interior of the encapsulation device, wherein the electrolysis unit has a cathode, an anode and an ion conductor connecting the cathode and anode and wherein the electrolysis unit is configured to split water into hydrogen and oxygen.

An important aspect of the invention is that the photovoltaic module with the solar cell enclosed by the encapsulation device has an electrolysis unit that can split any water that has entered the encapsulation, i.e. the interior of the encapsulation device, into hydrogen and oxygen. The "interior of the encapsulation device" refers here to the space or the region between the encapsulation and the solar cell. In other words, the interior of the encapsulation device may also be referred to as cavity. The statement that the solar cell is enclosed by an encapsulation device should therefore be understood to mean that the encapsulation device forms a closed cavity and the solar cell is arranged in this cavity.

There are a number of approaches for the encapsulation of solar cells of a photovoltaic module, of which two approaches are mentioned by way of example below.

The solar cells are generally applied to a carrier material for the purposes of static stabilization. In most cases the carrier material is glass, but use may also be made of plexiglass, metal or plastic films. Depending on the method, the solar cells may be situated on, behind or between the carrier material. What is important is that the cover on the light-sensitive side of the solar cell has high transmittance in order to pass on as much as possible of the incident solar energy to the solar cell.

The first approach, which is also referred to as glass/film encapsulation, involves the use of a hardened clear glass pane for the front side, a crosslinking polymer named ethylene-vinyl acetate (EVA) for embedding and a film composite for the reverse side. This film composite consists of three films. Bonded between two thin polyvinyl fluoride films (PVF, Tedlar) is a thicker film composed of polyethylene terephthalate (PET). This film composite ensures the electrical insulation to the rear and at the same time is very stable to weathering.

A second approach consists of the completely laminate-free encapsulation of the solar cells between two glass panes. The way in which the solar cells are encapsulated here is essentially similar to that in the construction of insulating-glass windows. The two glass panes are sealed at the edge, hermetically if possible. Useful options for this purpose are a butyl filled with a desiccant from the insulating glass industry or sealing of the edge by means of glass solder. Both technologies have the advantage that there is no longer any polymer in front of the solar cells, the light permeability of which polymer can be reduced by sunlight. In addition, the lamination step that takes about 20 minutes is replaced by a significantly shorter and more cost-effective pressing and edge-sealing step.

Different components can therefore function as encapsulation device in the context of the invention. If, for example, the solar cells are arranged between two glass panes and the lateral edges are sealed, the glass panes with the edge sealing are considered to be the encapsulation device. The electrolysis unit would then be configured to split water that has entered the cavity between the glass panes. If, for example, the solar cells are embedded in EVA, the EVA may also serve as the encapsulation device. The electrolysis unit would then be configured to dehumidify the region between the EVA and the solar cells by splitting any water that is present there. If the solar cells are both embedded in a crosslinking polymer and arranged between two glass panes with edge sealing, the electrolysis unit can be configured both for the dehumidification of the region between the polymer and the solar cells and for the region between the glass panes and the polymer.

It is emphasized that the present invention can be used for basically any type of encapsulation device. The embodiments specified in the description and the claims are merely illustrative and are not intended to restrict the scope of protection.

The electrolysis unit has a cathode, an anode and an ion conductor connecting the cathode and anode. The cathode and the anode are also referred to as electrodes. A DC voltage is applied at the two electrodes. The voltage source brings about an electron deficiency in the electrode connected to the positive pole, the anode, and an electron excess in the other electrode connected to the negative pole, the cathode. The gaseous hydrogen that has separated out accumulates at the cathode and rises up it; the gaseous oxygen that has separated out does the same at the anode. The reaction scheme for water electrolysis is:

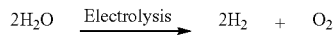

An ion conductor is present between the electrodes. The ion conductor is also referred to as electrolyte and comprises a chemical compound that is dissociated into ions in the solid, liquid or dissolved state and that moves in a directed manner under the influence of an electric field.

In one embodiment, for the electrolysis unit for dehumidifying the interior of the encapsulation device, use is made not of a liquid electrolyte but of a solid-state electrolyte, also referred to as solid electrolyte. The reason for this is that, in most cases, it is undesirable to have a liquid within the encapsulation device, since it may damage the solar cell (the very purpose of the electrolysis unit is to dehumidify the interior of the encapsulation device).

Advantageous ion conductors for the present invention are, for example, proton-exchange membranes (polymer electrolyte membranes, PEM) or ceramics with the general structure $Na_{1+x}Zr_2Si_xP_{3-x}O_{12}$, $0<x<3$ (sodium (Na) super ionic conductor, NASICON). Use may alternatively be made of other known solid-state electrolytes, such as yttrium-stabilized zirconium dioxide, doped lanthanum fluoride or sodium β-aluminate.

Once the water within the encapsulation device has been split, the hydrogen and oxygen should leave the interior of the encapsulation device so as to not recombine again to form water.

On account of their very small size, the hydrogen molecules can diffuse through the majority of materials without difficultly. The greater challenge is therefore to also "transport" the oxygen molecules to the outside. Consequently, in one embodiment of the invention, at least the anode is arranged outside the encapsulation device so that the oxygen discharged at the anode can be released directly to the environment. If, however, the material of the encapsulation device also has a sufficiently high permeability for the oxygen molecules, it is likewise conceivable to arrange both the anode and the cathode each completely within the encapsulation device.

In a further attractive embodiment of the invention, the ion conductor itself constitutes a part of the encapsulation device. In particular, the ion conductor thus replaces a part of the encapsulation device, namely at its position where it constitutes the boundary between the interior and the exterior of the encapsulation device.

In a further attractive embodiment of the invention, the ion conductor is mounted on the inside of a part of the encapsulation device. The ion conductor therefore has a stable "attachment" and is arranged close to the outside environment (only separated by the encapsulation device itself).

In order to rule out any shadowing of the solar cell(s) of the photovoltaic module from the outset, in one embodiment of the invention the electrolysis unit may be arranged opposite that side of the photovoltaic module intended for exposure of the photovoltaic module to electromagnetic radiation from the sun. In other words, the electrolysis unit may thus be on the reverse side of the photovoltaic module.

Alternatively, in another embodiment of the invention, the electrolysis unit may also be arranged on or in the frame of the photovoltaic module (provided that the photovoltaic module has a frame), in order to avoid shadowing of the solar cell by the electrolysis unit. This variant appears to be advantageous particularly for that embodiment in which the anode of the electrolysis unit is arranged outside the encapsulation device, since there is thus no need for a passage (or breakthrough) of the anode through the encapsulation device. This appears to be advantageous particularly if the encapsulation device consists essentially of a glass pane that would otherwise have to be pierced for the passage for the anode.

The present invention can in principle be used on any type of photovoltaic modules. It appears to be particularly advantageous, however, in connection with photovoltaic modules with perovskite solar cells. This is because, particularly in perovskite solar cells, even small amounts of moisture can lead to serious damage to the perovskite solar cells. This can ultimately lead to an often irreversible reduction in the efficiency of the perovskite solar cell and thus to a low yield of electrical energy from the corresponding photovoltaic module that has perovskite solar cells.

The dehumidification of the interior of the encapsulation device, i.e. the operation of the electrolysis unit, is a process that costs energy. Consequently, in one embodiment of the invention, the photovoltaic module is configured in such a way that the electrolysis unit can be operated directly using the electrical energy generated by the solar cell(s).

It can otherwise be assumed, however, that with an intrinsically functioning and stable encapsulation, only very small amounts of water can enter the interior of the encapsulation device in the first place. The energy required for the operation of the electrolysis unit is consequently regarded as low.

In addition to the photovoltaic module with the electrolysis unit, the invention is also directed to a method for dehumidifying a photovoltaic module. The photovoltaic module comprises at least one solar cell, an encapsulation device and an electrolysis unit. The electrolysis unit is configured to split water into hydrogen and oxygen. The solar cell is enclosed by the encapsulation device. The electrolysis unit has a cathode, an anode and an ion conductor connecting the cathode and anode.

The method comprises:
- applying an electric voltage, in particular a DC voltage, to the cathode and anode of the electrolysis unit in order to split water molecules adsorbed at the ion conductor into hydrogen and oxygen,
- discharging the hydrogen to the cathode and the oxygen to the anode, each via the ion conductor, and
- isolating the cathode and anode from the applied voltage.

In one possible variant, the isolation from the applied voltage follows after a predetermined period of time after the application of the voltage, wherein the period of time is in the range between 2 seconds and 2 minutes, in particular between 2 seconds and 60 seconds, particularly between 5 seconds and 20 seconds.

In other words, the electrolysis unit is advantageously activated only for a short period of time in each case. This reduces the energy consumption of the electrolysis unit and, in most practical cases, should nevertheless be sufficient to dehumidify the interior of the encapsulation device, particularly if the electrolysis unit is activated on a regular basis. By way of example, it may be advantageous if the electrolysis unit is operated at defined intervals of once per week or once per month. The voltage to be applied is in particular less than 10 volts. It is advantageously in the range of 1.2 volts to 5 volts, particularly in the range of 2.5 volts to 3 volts.

The method according to the invention also discloses a particular additional benefit: measuring the electrolysis current or the amount of charge used for the electrolysis makes it possible to determine the amount of water ingress and hence make an estimation of the quality of the encapsulation and the possible changes thereto using the ratio of amount of charge/interval for the electrolysis procedure. This enables an evaluation of the total lifetime of the photovoltaic module.

Furthermore, the process can be controlled by measuring the electrolysis current. For this, the electrolysis voltage is applied and the resulting electrolysis current is observed. As soon as the electrolysis current falls or does not occur at all, the water within the encapsulation has been removed.

Thus, in one advantageous embodiment of the invention, after the voltage has been applied, the electrolysis current is determined and the time at which the anode and cathode are isolated from the applied voltage is selected based on the determined electrolysis current.

BRIEF DESCRIPTION OF THE DRAWINGS

The invention is illustrated hereinafter on the basis of the attached figures.

The Figures Show:
FIG. 1: an electrolysis unit having a solid-state electrolyte as ion conductor,
FIG. 2: a first embodiment of the photovoltaic module according to the invention and
FIG. 3: a second embodiment of the photovoltaic module according to the invention.

DETAILED DESCRIPTION OF INVENTION

FIG. 1 (also referred to as FIG. 1) schematically shows an electrolysis unit 30. The electrolysis unit 30 has a first electrode that functions as cathode 31, and a second electrode that functions as anode 32. The two electrodes 31, 32 are connected to an ion conductor 33 in an electrically conductive manner. The ion conductor 33 in the example shown in FIG. 1 is a solid, for which reason it is referred to as solid-state electrolyte, for example to distinguish from otherwise customary liquid electrolytes.

When a DC voltage in the low or middle single-digit volt range (for example between 1.2 volts and 5 volts) is applied, water molecules that have accumulated on the ion conductor are split into hydrogen molecules ($H_2$) and oxygen molecules ($O_2$). The hydrogen molecules are positively charged ions and therefore migrate to the cathode 31, to which the negative pole of the DC voltage is applied. The oxygen molecules are negatively charged ions and therefore migrate to the anode 32, to which the positive pole of the DC voltage is applied. This results in splitting and separation of the water into hydrogen molecules and oxygen molecules.

FIG. 2 (also referred to as FIG. 2) depicts the electrolysis unit 30 shown in FIG. 1 in the way in which it can be integrated into a photovoltaic module 1. The photovoltaic module 1 has a multitude of solar cells 10, only one of which is shown in FIG. 2 for the sake of clarity. The solar cell 10 is enclosed by an encapsulation device 20. How the encapsulation device 20 is specifically configured is immaterial to the concept underlying the invention (a couple of possible implementations of the encapsulation of a solar cell were disclosed by way of example in the general description of the invention). The encapsulation device 20 completely encloses the solar cell 10 and thus protects it from soiling, moisture and mechanical actions.

The electrolysis unit 30 is placed in a region within the encapsulation device 20. The cathode 31 and the anode 32 of the electrolysis unit 30 and the ion conductor 33 connecting the two electrodes 31, 32 are located completely within the encapsulation device 20. Only the electrical wires for supplying the electrodes extend outside of the encapsulation device 20. Care must be taken to prevent any ingress of water from the outside at the leadthroughs at which the electrical conductors are led from the inside to the outside through the encapsulation device 20 (glass panes, cured EVA, etc.).

The electrolysis unit 30 is provided for water molecules that, in whatever way, still get into the interior of the encapsulation device 20. When voltage is applied, water molecules that have accumulated on the ion conductor 33 are split and migrate as gaseous hydrogen and oxygen molecules to the cathode and anode, respectively. In other words they are led off thereto. They accumulate there and become detached after a while. In the embodiment shown in FIG. 2, the encapsulation device 20 is configured such that both the hydrogen molecules and the oxygen molecules can diffuse through the material of the encapsulation device 20. They thus escape from the interior of the encapsulation device 20, and therefore the interior of the encapsulation device 20 is dehumidified in this way.

FIG. 3 (also referred to as FIG. 3) shows a slightly modified embodiment of the photovoltaic module 1 according to the invention. Here, the electrolysis unit 30 is integrated into the encapsulation device 20. In particular, the ion conductor 33, here too again a solid-state electrolyte, constitutes a part of the encapsulation device 20. If, for example, the encapsulation device 20 essentially comprises two glass panes that are arranged plane-parallel to one another, a cutout region in one glass pane would be filled by the ion conductor 33. This has the advantage that the anode 32 can be arranged on the outside (i.e. outside of the encapsulation device 20) and therefore the larger oxygen molecules do not have to diffuse through the encapsulation device 20, but can escape directly to the outside.

In summary, the present invention demonstrates an elegant way of keeping the interior of a photovoltaic module dry as efficiently and permanently as possible. This has great practical significance in particular for photovoltaic modules with perovskite solar cells or tandem solar cells with a perovskite portion.

LIST OF REFERENCE NUMERALS

1 Photovoltaic module
10 Solar cell
20 Encapsulation device
30 Electrolysis unit
31 Cathode
32 Anode
33 Ion conductor

The invention claimed is:

1. A photovoltaic module, comprising:
a solar cell contained within an encapsulation device, wherein the encapsulation device is selected from the group consisting of an encapsulant, a front glass panel and a back glass panel sealed along lateral edges thereof, and combinations thereof, and
an electrolysis unit for dehumidifying the solar cell, the electrolysis unit at least partially disposed in an interior of the encapsulation device,
wherein the electrolysis unit has a cathode, an anode and an ion conductor connecting the cathode and the anode, and
wherein the electrolysis unit is configured to split water adsorbed on the ion conductor into hydrogen and oxygen and to move the hydrogen and the oxygen outside the photovoltaic module.

2. The photovoltaic module as claimed in claim 1, wherein at least the anode is arranged outside the encapsulation device so that the oxygen formed at the anode is releasable directly to the environment.

3. The photovoltaic module as claimed in claim 1, wherein the ion conductor is mounted on the inside of a part of the encapsulation device.

4. The photovoltaic module as claimed in claim 1, wherein the ion conductor constitutes a part of the encapsulation device.

5. The photovoltaic module as claimed in claim 1, wherein both the anode and the cathode are each arranged completely within the encapsulation device.

6. The photovoltaic module as claimed in claim 1, wherein the electrolysis unit is arranged opposite that side of the photovoltaic module intended for exposure of the photovoltaic module to electromagnetic radiation from the sun.

7. The photovoltaic module as claimed in claim 1, wherein the solar cell is a perovskite solar cell.

8. The photovoltaic module as claimed in claim 1, wherein the encapsulation device on a side of the photovoltaic module intended for exposure of the photovoltaic module to electromagnetic radiation from the sun is essentially transparent in a wavelength range of an activation energy.

9. The photovoltaic module as claimed in claim 1, wherein the encapsulant includes a crosslinking polymer, in particular ethylene-vinyl acetate, and the solar cell is embedded in the crosslinking polymer.

10. The photovoltaic module as claimed in claim 1, wherein the photovoltaic module is also configured in such a way that the electrolysis unit is operable directly using electrical energy generated by the solar cell.

11. A method, comprising:
dehumidifying an interior volume of an encapsulation device of a photovoltaic module, which is effective to reduce an exposure of a solar cell disposed in the interior volume to water, by:
adsorbing water molecules from the interior volume onto an ion conductor of an electrolysis unit,
applying a DC voltage to a cathode and an anode of the electrolysis unit for a predetermined period of time in order to split the water molecules adsorbed at the ion conductor into hydrogen and oxygen, discharging the hydrogen to the cathode and the oxygen to the anode, each via the ion conductor,
moving the hydrogen and the oxygen from the interior volume of the encapsulation device to outside the encapsulation device, and
isolating the cathode and the anode from the applied DC voltage after the predetermined period of time.

12. The method as claimed in claim 11, wherein the predetermined period of time is in a range between 2 seconds and 2 minutes.

13. The method as claimed in claim 11, wherein the applied DC voltage is less than 10 volts.

14. The method as claimed in claim 11, wherein the DC voltage is applied at defined intervals.

15. The method as claimed in claim 11, wherein, after the DC voltage has been applied for the predetermined period of time, an electrolysis current is determined and a time at which the cathode and the anode are isolated from the applied DC voltage is selected based on the determined electrolysis current.

16. The method as claimed in claim 12, wherein predetermined period of time is in a range between 5 seconds and 20 seconds.

17. The method as claimed in claim 13, wherein the applied DC voltage is in a range of 2.5 volts to 3 volts.

18. The method as claimed in claim 14, wherein a defined interval is once per week.

* * * * *